Nov. 2, 1965 J. T. WARNOCK 3,215,851
EMITTER FOLLOWER WITH NON-SATURATING DRIVER
Filed Oct. 25, 1955
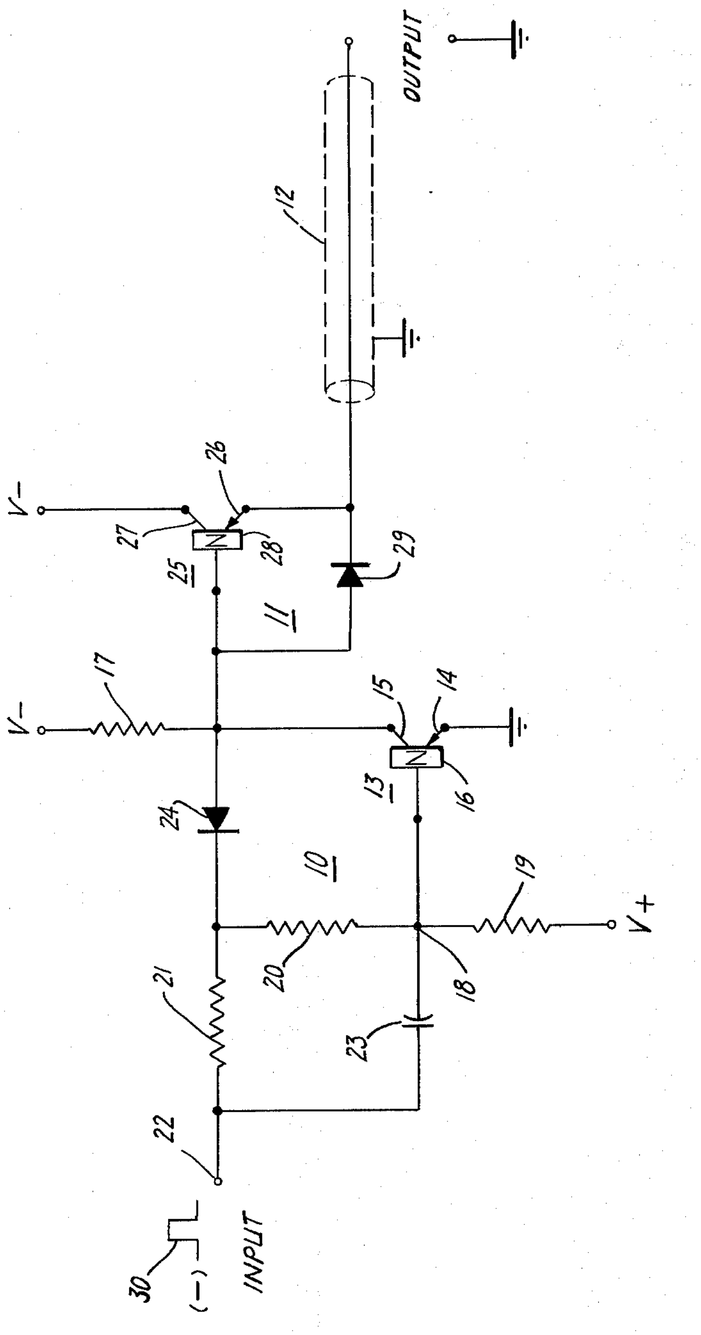
INVENTOR.
JAMES T. WARNOCK
BY
[signature]
ATTORNEY United States Patent Office 3,215,851

Patented Nov. 2, 1965

3,215,851

EMITTER FOLLOWER WITH NON-SATURATING DRIVER

James T. Warnock, Havertown, Pa., assignor, by mesne assignments, to Philco Corporation, Philadelphia, Pa., a corporation of Delaware Filed Oct. 25, 1955, Ser. No. 542,712
4 Claims. (Cl. 307—88.5)

This invention relates to electrical circuits utilizing transistors, and more particularly, to a novel circuit especially adapted to transfer binary digital information from a fairly high impedance source to a low impedance output circuit.

As is well known, the term "transistor" designates a device comprising a body of semiconductive material, and at least three electrodes associated with said body and designated respectively as the emitter, the collector and the base electrode.

The principal object of the present invention is to provide a circuit having a very low impedance output for both high and low signal levels such as are present in binary digital information.

Another object of the invention is to provide such a circuit which is capable of performing efficient and distortionless transfer of binary digital information.

The circuit provided by this invention is principally characterized in that it employs in its output an emitter follower transistor and an associated unilateral conductive device such as a diode which device is arranged so as to provide a low impedance transfer path when the transistor is not conducting. Thus, when a signal supplied to the output stage swings in one polarity direction, the transistor conducts and provides a low impedance transfer path, and when the signal swings in the opposite polarity direction, the unilaterally conductive device conducts and provides a low impedance transfer path. With a driven load connected to the output stage, the latter serves as an efficient low impedance output signal source during both positive and negative swings of the applied signal.

The preferred embodiment of the circuit provided by this invention is further characterized in that it comprises a grounded emitter amplifier stage in advance of the output stage, said amplifier stage being constructed and arranged to effect efficient and distortionless transfer of rapidly varying input signals to the output stage. More particularly, the amplifier stage comprises a transistor and an associated unilaterally conductive device, such as a diode, arranged to prevent the transistor from being driven into saturation.

The transistors employed in the circuit of this invention may be of any type, such as junction, point contact, and surface barrier transistors. For the purpose of description only, it will be assumed that they are of the P-N-P junction type. The unilaterally conductive devices employed in the circuit may be crystal diodes, or they may be of any other conventional form.

The invention may be fully understood from the following detailed description with reference to the accompanying drawing wherein the single figure is a diagrammatic illustration of a preferred embodiment of the circuit according to this invention.

Referring more particularly to the drawing, in this preferred embodiment of the invention the circuit comprises a grounded emitter amplifier stage 10 and an emitter follower output stage 11. As previously indicated, the principal purpose of the circuit is to provide a low impedance output to a connected load for both high and low signal levels such as are present in binary digital information. As the circuit is particularly suitable for driving a high capacity load, such as a coaxial cable, the load is here shown as a coaxial cable 12.

The amplifier stage 10 employes a transistor 13 having an emitter 14, a collector 15, and a base electrode 16. The emitter 14 is grounded, while the other two electrodes are connected to biasing voltage sources. The collector 15 is connected to a source V— through the load resistor 17. The base electrode 16 is connected to a junction point 18 of a voltage divider comprising resistors 19, 20 and 21 which are serially connected between a source V+ and input terminal 22. This terminal, at the low level of an input signal, may be at a negative potential substantially equal in magnitude to the voltage of source V+ so that the transistor 13 conducts, and at the high level of the signal, the terminal 22 may be substantially at zero potential so that the transistor is cut-off by the positive potential applied to its base from source V+. The base elecrode 16 is coupled to input terminal 22 through capacitor 23. A unilaterally conductive device 24, such as a diode, is connected as shown between the upper end of resistor 20 and the collector 15, the purpose of which will be described presently.

The output stage 11 employs a transistor 25 having an emitter 26, a collector 27, and a base electrode 28. The collector 27 is connected to a source V— of biasing voltage. The base electrode 28 is connected directly to the collector 15 of transistor 13. The emitter 26 is connected directly to the load 12. The stage 11 further comprises a unilaterally conductive device 29, such as a diode, which is connected between the collector 15 of transistor 13 and emitter 26 of transistor 25.

As indicated at the outset, the principal feature of this invention is the low impedance output circuit 11, while a second feature of the invention is the combination of this low impedance output circuit and the grounded emitter amplifier stage 10.

Considering the operation of the circuit with particular attention to what happens in the output stage, at the low level of the input signal, transistor 13 is highly conductive and the potential on its collector and hence on the base electrode of transistor 25 is relatively high, and transistor 25 is cut off. As the input signal represented at 30 swings in the positive direction, the potential of the base electrode 16 of transistor 13 becomes positive, and consequently the conductivity of transistor 13 decreases to cut-off, causing decrease of its load current and decrease of the voltage rise across resistor 17, and thus causing the collector potential to become more negative. Thus the potential at the base of transistor 25 swings in the negative direction and causes transistor 25 to conduct. During conduction of the latter transistor, its impedance is very low, and consequently it provides a low impedance transfer path to the load 12 for current flowing in its collector-emitter circuit. At this time the unilaterally conductive device 29 is not conducting, due to the manner in which it is poled, there being a negative voltage applied to its anode.

As the input signal swings in the negative direction, the potential at the base electrode 16 of transistor 13 swings in the negative direction, and consequently transistor 13 is rendered conductive. The load current through the load resistor 17 cause a voltage rise across this resistor, and consequently causes the potential of collector 15 to swing in the positive direction. Therefore, the output signal of stage 10 swings in the positive direction and causes cut-off of transistor 25. This positive swing of the signal also biases the unilaterally conductive device 29 into conduction so that its impedance is very low. Thus, this device provides a low impedance signal transfer path to the load 12 when the transistor 25 is cut off.

It will be seen, therefore, that the output stage 11 constitutes a low impedance output source for the load 12 during both positive and negative swings of the input signal supplied to the circuit.

Considering now more particularly the amplifier stage 10, this stage serves to effect distortionless amplification of the input signal and transfer of the amplified signal to the output stage. As will be well understood, variations of the signal supplied to the transistor 13 will produce very pronounced changes in the output current thereof. In order to achieve and maintain distortionless amplification of the input signal, it is necessary to maintain at all times a sufficient difference of potential between the collector 15 and the base electrode 16 to prevent the transistor from being driven into saturation. That is to say, the potential of the collector must be maintained sufficiently negative with respect to the base electrode to enable the collector to collect all of the charge carriers (holes in the case of the P-N-P junction transistor) which are supplied to it. Otherwise, saturation will occur and the variations of the input signal will not be faithfully reproduced in the output. This effect tends to occur during heavy conduction when the potential of the collector 15 rises substantially due to the relatively large voltage rise across the load resistor 17.

However, this undesired effect is prevented by reason of the presence of resistor 20 and the unilaterally conductive device 24. As long as the potential of the collector 15 is sufficiently low, there is no conduction by the device 24; but whenever the collector potential exceeds the potential of the upper end of resistor 20, the device 24 conducts and reduces the base current until the latter equals that required to cause the collector to assume the potential at the upper end of resistor 20. As a result, the collector output level controls the input base current, and objectionable saturation is prevented without affecting the gain or input impedance of the stage.

From the foregoing description it will be seen that the present invention provides a circuit which faithfully reproduces and amplifies sharply varying signals, such as those representing binary digital information, and which also has desirable low impedance output characteristics. The circuit is particularly well suited for driving a high capacitive load such as a coaxial cable, since peak power is consumed only during the charging or discharging of the load, and the average power dissipation is relatively low.

For exemplary purposes only, there is listed below a set of typical values for the circuit components illustrated, which permit operation of the circuit at high pulse repetition rates without appreciable distortion of pulse waveforms.

| | | |
|---|---|---|
| Source of bias potential V− | v | −6 |
| Source of bias potential V+ | v | +6 |
| Capacitor **23** | μμf | 470 |
| Resistor **17** | ohms | 2,200 |
| Resistor **19** | do | 22,000 |
| Resistor **20** | do | 1,000 |
| Resistor **21** | do | 10,000 |

While a single preferred embodiment of the invention has been illustrated and described, it is to be understood that the invention is not limited thereto but contemplates such modification and further embodiments as may occur to those skilled in the art.

I claim:

1. In a signal transfer circuit, a first transistor having an emitter, a collector and a base electrode, means maintaining said emitter at ground potential, a load resistor connected to said collector, means supplying a biasing potential to said collector through said resistor, means supplying a biasing potential to said base electrode, a signal input connection to said base electrode, means for preventing the potential of said collector from reaching a value to cause saturation of said transistor, a second transistor, means for supplying signal from said first transistor to said second transistor, said second transistor being conductive and providing a low impedance transfer path when the signal supplied thereto swings in one polarity direction and becoming substantially non-conductive and presenting high impedance when the signal swings in the other polarity direction, and a unilaterally conductive device connected directly in shunt with said path to provide a low impedance transfer path about said second transistor when the latter is substantially non-conductive and to present high impedance when said second transistor is conductive.

2. A circuit according to claim 1, wherein said means for preventing saturation of said first transistor comprises a resistor and a unilaterally conductive device connected between the collector and base electrode of the first transistor.

3. In a signal transfer circuit, a first transistor having an emitter, a collector and a base electrode, means maintaining said emitter at ground potential, a load resistor connected to said collector, means supplying a biasing potential to said collector through said resistor, means supplying a biasing potential to said base electrode, a signal input connection to said base electrode, means for preventing the potential of said collector from reaching a value to cause saturation of said transistor, a second transistor having an emitter, a collector, and a base electrode, an output load connected to the emitter of said second transistor, a biasing voltage source connected to the collector of said second transistor, means for supplying signal from the collector of said first transistor to the base electrode of said second transistor, whereby said second transistor conducts and provides a low impedance transfer path to said load when the signal supplied thereto swings in one polarity direction and becomes substantially non-conductive and presents high impedance when the signals swings in the other polarity direction, and a unilaterally conductive device connected directly between the base electrode and the emitter of said second transistor and poled so as to be conductive and provide a low impedance transfer path when the supplied signal swings in the second polarity direction and to become substantially non-conductive and present high impedance when the signal swings in the first polarity direction.

4. A circuit according to claim 3, wherein said means for preventing saturation of said first transistor comprises a resistor and a unilaterally conductive device connected between the collector and base electrode of the first transistor.

References Cited by the Examiner

UNITED STATES PATENTS

| | | | |
|---|---|---|---|
| 2,585,077 | 2/52 | Barney. | |
| 2,662,122 | 12/53 | Ryder. | |
| 2,666,818 | 1/54 | Shockley. | |
| 2,705,287 | 3/55 | Wu-Nien Lo | 307—88.5 |
| 2,744,169 | 5/56 | Deming. | |
| 2,764,643 | 9/56 | Sulzer | 330—19 X |
| 2,789,164 | 4/57 | Stanley. | |

OTHER REFERENCES

"Circuit Design for Transistors and Junction Devices," by James B. Angell (p. 5, Fig. 7) reprint from vol. XI, Proceedings of Electronics Conference, Chicago, Ill., Oct. 3, 4, 5, 1955, reprint in Div. 51 with reference to Ref. 9 of above to Paper by Warnock given at IRE-AIEE Conference on Transistor Circuits, Philadelphia, Pa., Feb. 19, 1954.

Shea: "Transistor Circuits" first edition 1953 (particularly p. 296, Fig. 14.10).

GEORGE N. WESTBY, *Primary Examiner.*

NORMAN H. EVANS, HARRY GAUSS, ELI J. SAX, *Examiners.*